(12) United States Patent
Hakuma et al.

(10) Patent No.: US 8,501,519 B2
(45) Date of Patent: Aug. 6, 2013

(54) METHOD OF PRODUCTION OF CIS-BASED THIN FILM SOLAR CELL

(75) Inventors: Hideki Hakuma, Tokyo (JP); Tetsuya Aramoto, Tokyo (JP); Yoshiyuki Chiba, Tokyo (JP); Yoshiaki Tanaka, Tokyo (JP)

(73) Assignee: Showa Shell Sekiyu K.K., Tokyo (JP)

(*) Notice: Subject to any disclaimer, the term of this patent is extended or adjusted under 35 U.S.C. 154(b) by 0 days.

(21) Appl. No.: 13/515,721

(22) PCT Filed: Dec. 14, 2010

(86) PCT No.: PCT/JP2010/072828
§ 371 (c)(1),
(2), (4) Date: Jun. 13, 2012

(87) PCT Pub. No.: WO2011/074685
PCT Pub. Date: Jun. 23, 2011

(65) Prior Publication Data
US 2012/0258562 A1    Oct. 11, 2012

(30) Foreign Application Priority Data
Dec. 16, 2009  (JP) .................................. 2009-285318

(51) Int. Cl.
*H01L 21/00* (2006.01)

(52) U.S. Cl.
USPC .......... 438/69; 438/85; 438/95; 438/98; 257/184; 257/461; 257/E31.027; 257/E31.008; 136/256; 136/264; 136/265

(58) Field of Classification Search
USPC .......... 438/69, 85, 95, 98, 102; 257/184, 257/461, E31.027, E31.126, E31.008; 136/256, 136/264–265
See application file for complete search history.

(56) References Cited

U.S. PATENT DOCUMENTS

| 6,800,182 | B2 | 10/2004 | Mitsui et al. |
| 2011/0067755 | A1 | 3/2011 | Hakuma et al. |

FOREIGN PATENT DOCUMENTS

| JP | 6-97052 | 4/1994 |
| JP | 8-222750 | 8/1996 |
| JP | 11-135819 | 5/1999 |
| JP | 11-274534 | 10/1999 |

(Continued)

OTHER PUBLICATIONS

Notice of Reasons for Rejection mailed Feb. 1, 2011, directed to Japanese Application No. 2009-285318; 5 pages.

(Continued)

*Primary Examiner* — Evan Pert
*Assistant Examiner* — Mark A Laurenzi
(74) *Attorney, Agent, or Firm* — Morrison & Foerster LLP

(57) ABSTRACT

A method of production of a CIS-based thin film solar cell comprises the steps of forming an alkali control layer on a high strain point glass substrate, forming a back surface electrode layer on the alkali control layer, forming a CIS-based light absorption layer on the back surface electrode layer, and forming an n-type transparent conductive film on the CIS-based light absorption layer, wherein the alkali control layer is formed to a thickness which allows heat diffusion of the alkali metal which is contained in the high strain point glass substrate to the CIS-based light absorption layer and, furthermore, the CIS-based light absorption layer has an alkali metal added to it from the outside in addition to heat diffusion from the high strain point glass substrate.

10 Claims, 4 Drawing Sheets

FOREIGN PATENT DOCUMENTS

| | | |
|---|---|---|
| JP | 2000-17430 | 1/2000 |
| JP | 2003-318424 | 11/2003 |
| JP | 2004-165195 | 6/2004 |
| JP | 2005-36250 | 2/2005 |
| JP | 2006-165386 | 6/2006 |
| JP | 2009-283560 | 12/2009 |
| WO | WO-01/27345 | 4/2001 |

OTHER PUBLICATIONS

Transcript of Decision of Final Rejection mailed Nov. 22, 2011, directed to Japanese Application No. 2009-285318; 5 pages.

International Search Report mailed Feb. 1, 2011, directed to International Application No. PCT/JP2010/072828; 3 pages.

Notice of Reasons for Rejection mailed May 28, 2013, directed to Japanese Patent Application No. 2012-036194; 5 pages.

Fig. 2

PHOTOELECTRIC CONVERSION EFFICIENCY [Eff]

| | SAMPLE NO. | SILICA FILM THICKNESS [nm] | AMOUNT OF ADDITION OF Na [at%] | |
|---|---|---|---|---|
| EXAMPLES OF PRESENT INVENTION | 1 | 3 | 0.1 | 13.41 |
| | 2 | 3 | 0.1 | 13.62 |
| | 3 | 3 | 0.1 | 13.76 |
| | 4 | 3 | 0.02 | 13.95 |
| | 5 | 3 | 0.02 | 13.85 |
| | 6 | 3 | 0.03 | 13.99 |
| | 7 | 3 | 0.03 | 14.35 |
| | 8 | 3 | 0.05 | 13.37 |
| | 9 | 3 | 0.05 | 13.74 |
| | 10 | 3 | 0.05 | 13.85 |
| | 11 | 12 | 0.1 | 13.41 |
| | 12 | 12 | 0.1 | 13.83 |
| | 13 | 12 | 0.1 | 13.41 |
| | 14 | 12 | 0.1 | 13.67 |
| | 15 | 12 | 0.02 | 13.63 |
| | 16 | 12 | 0.02 | 13.14 |
| | 17 | 12 | 0.05 | 13.80 |
| | 18 | 12 | 0.05 | 13.55 |
| | 19 | 12 | 0.05 | 13.75 |
| | 20 | 12 | 0.05 | 13.85 |
| FIRST COMPARATIVE EXAMPLES | 21 | 3 | 0 | 12.84 |
| | 22 | 3 | 0 | 13.28 |
| | 23 | 3 | 0 | 13.29 |
| | 24 | 12 | 0 | 12.23 |
| | 25 | 12 | 0 | 12.78 |
| | 26 | 12 | 0 | 12.26 |
| | 27 | 12 | 0 | 12.53 |
| | 28 | 30 | 0 | 11.51 |
| | 29 | 30 | 0 | 10.92 |
| SECOND COMPARATIVE EXAMPLES | 30 | 30 | 0.05 | 11.06 |
| | 31 | 30 | 0.05 | 11.38 |
| | 32 | 30 | 0.1 | 12.60 |
| | 33 | 30 | 0.1 | 12.47 |
| | 34 | 30 | 0.15 | 8.79 |
| | 35 | 30 | 0.15 | 7.86 |
| THIRD COMPARATIVE EXAMPLES | 36 | 0 | 0 | 13.03 |
| | 37 | 0 | 0 | 6.97 |
| | 38 | 0 | 0.02 | 9.13 |
| | 39 | 0 | 0.02 | 8.61 |
| | 40 | 0 | 0.05 | 13.61 |
| | 41 | 0 | 0.05 | 6.63 |
| | 42 | 0 | 0.1 | 13.42 |
| | 43 | 0 | 0.1 | 13.27 |
| | 44 | 0 | 0.15 | 12.34 |
| | 45 | 0 | 0.15 | 12.00 |

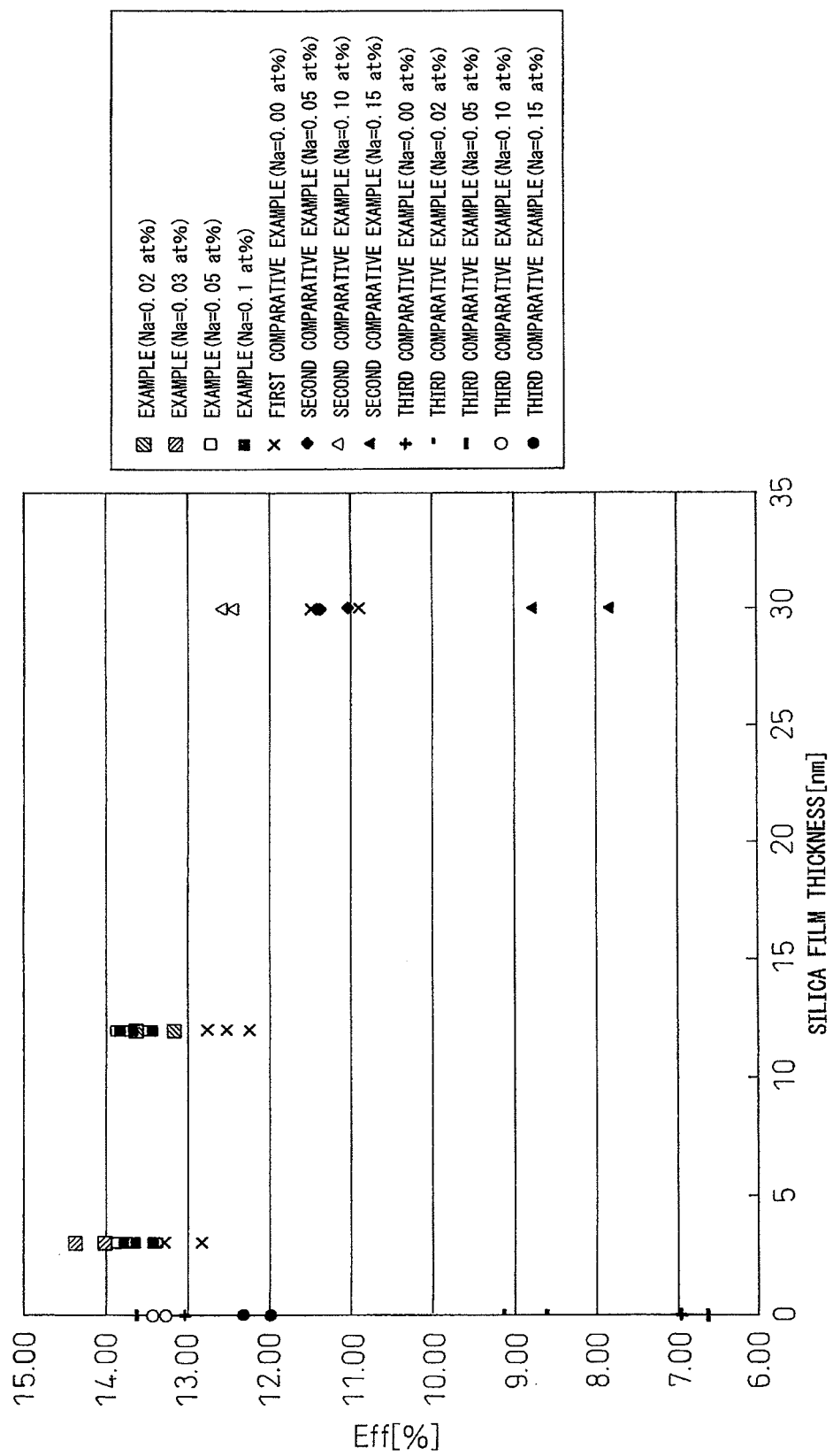

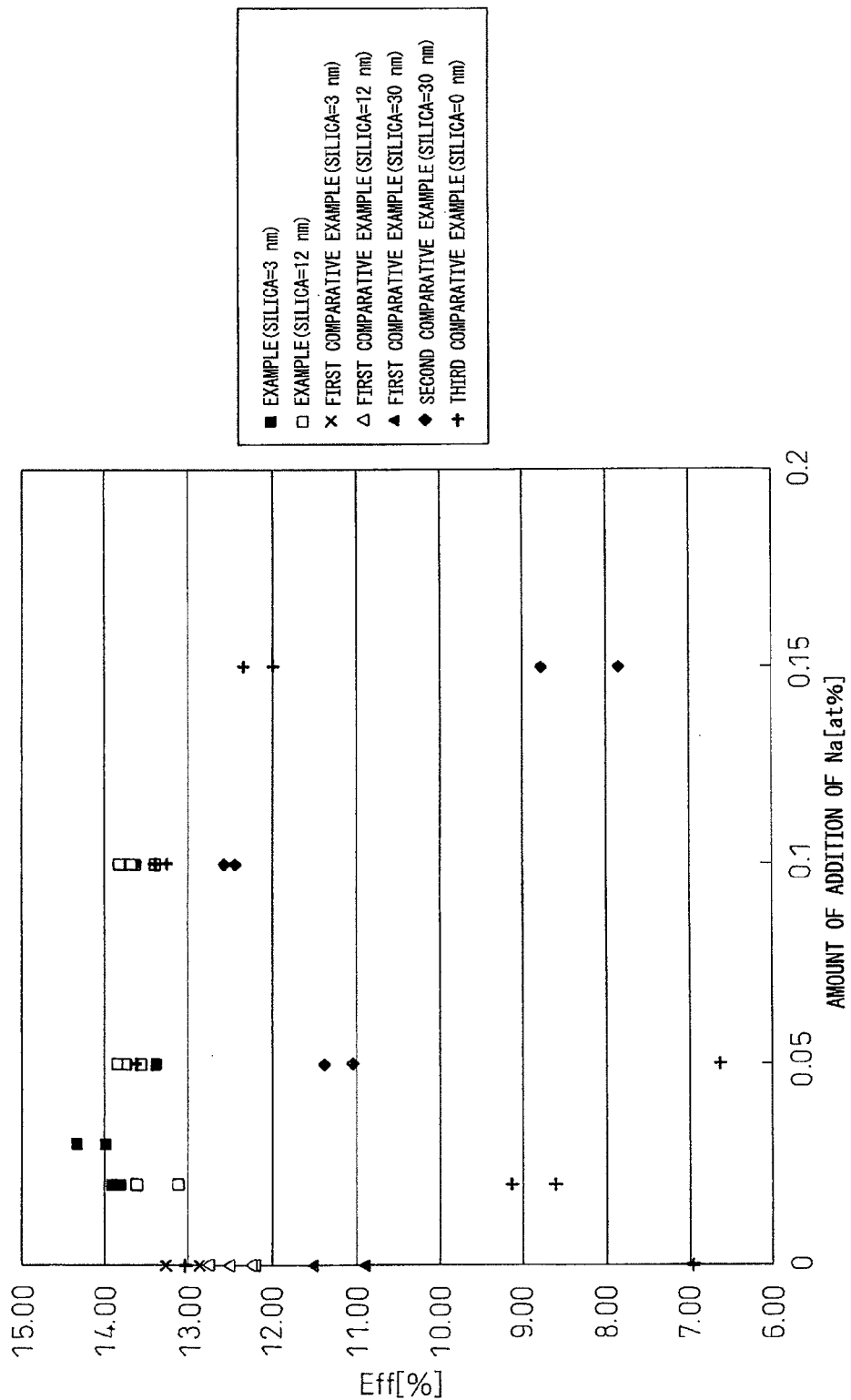

METHOD OF PRODUCTION OF CIS-BASED THIN FILM SOLAR CELL

TECHNICAL FIELD

The present invention relates to a method of production of a CIS-based thin film solar cell, more particularly relates to a method of production of a CIS-based thin film solar cell which enables achievement of a high photoelectric conversion efficiency.

BACKGROUND ART

In recent years, CIS-based thin film solar cells, which use Group I-III-VI$_2$ compound semiconductors of chalcopyrite structures including Cu, In, Ga, Se, and S as the p-type light absorption layers, have become the focus of attention. This type of solar cell has a relatively low manufacturing cost, and further a large absorption coefficient in the wavelength range from visible light to near infrared light, so promises a high photoelectric conversion efficiency and is regarded as a leading candidate for the next generation of solar cells. As typical materials, there are Cu(In, Ga)Se$_2$, Cu(In, Ga) (Se, S)$_2$, CuInS$_2$, etc.

A CIS-based thin film solar cell is comprised of a glass substrate on which a metal back surface electrode layer is formed, a p-type light absorption layer comprised of a I-III-VI$_2$ group compound which is formed on top of that, and furthermore an n-type high resistance buffer layer and an n-type transparent conductive film window layer which are formed on top of that. In such a CIS-based thin film solar cell, it is reported that when using soda lime glass as the glass substrate, a high photoelectric conversion efficiency can be achieved.

This is believed to be because the Group Ia elements (in particular Na) which are contained in soda lime glass diffuse by heat treatment in the p-type light absorption layer in the process of forming that layer and promote crystal growth and have an effect on the carrier concentration. On the other hand, if the amount of Na which is introduced into the p-type light absorption layer is too great, the problem has also been pointed out that peeling from the back surface electrode layer easily occurs. Therefore, when manufacturing a CIS-based thin film solar cell, introduction of the optimum amount of Na into the p-type light absorption layer is extremely important in improving the photoelectric conversion efficiency.

The method has been proposed of providing an alkali diffusion prevention layer of a thickness of 20 to 100 nm made of aluminum oxide, titanium nitride, silicon dioxide, etc. between the soda lime glass substrate and the back surface electrode layer so as to completely prevent the diffusion of Na etc. from the glass substrate to the inside of the p-type light absorption layer and, on the other hand, when forming the p-type light absorption layer, adding Na or another alkali metal from the outside so as to attempt to accurately control the content of alkali metal in the p-type light absorption layer (see PLT 1).

Further, the method has also been proposed of, instead of adding Na etc. to the p-type light absorption layer, introducing a Group Ia element, for example, Na, which is contained in the soda lime glass substrate into the p-type light absorption layer in a suitable amount during the process of forming the layer by means of providing an alkali control layer of a thickness of 20 nm to 50 nm made of silica etc. between the soda lime glass substrate and the back surface electrode layer (see PLT 2).

On the other hand, to improve the photoelectric conversion efficiency of a CIS-based thin film solar cell, it is necessary, it is pointed out, to make the film forming temperature when forming the p-type light absorption layer, that is, the selenization and sulfurization temperature, a high temperature. By performing the film forming process at a high temperature, the quality of the p-type light absorption layer is improved and, as a result, the photoelectric conversion efficiency is also improved. Soda lime glass has a relatively low strain point, therefore, if forming the p-type light absorption layer at a high film forming temperature, for example, 550° C. or more, so as to further raise the photoelectric conversion efficiency, the glass substrate will deform, so the film forming temperature cannot be raised. As opposed to this, PLT 3 discloses to use high strain point glass as the substrate of the CIS-based thin film solar cell so as to suppress deformation of the glass substrate due to the heat history and strain due to the difference in thermal expansion coefficients between the substrate and the CIS-based semiconductor layer.

Here, the inventors ran experiments in which they used high strain point glass as the glass substrate and raised the temperature of the sulfurization or selenization to a high temperature. As a result, strain of the substrate of the solar cell which was produced could be suppressed, but a high photoelectric conversion efficiency could not be achieved. This was due to the fact that high strain point glass is low Na glass, so diffusion of Na to the p-type light absorption layer was insufficient. Further, in a further experiment of the inventors using high strain point glass as the glass substrate, to sufficiently introduce Na into the p-type light absorption layer, a 30 nm to 50 nm alkali barrier layer which was disclosed in the above PLT's 1 and 2 was provided and Na was added to the p-type light absorption layer, but in this experiment as well, a solar cell which has a high photoelectric conversion efficiency could not be obtained.

PATENT LITERATURE (PLT)

PLT 1: Japanese Patent Publication (A) No. 8-222750
PLT 2: Japanese Patent Publication (A) No. 2006-165386
PLT 3: Japanese Patent Publication (A) No. 11-135819

SUMMARY OF INVENTION

The present invention has as its task to solve the problems in the conventional method of production of a CIS-based thin film solar cell, specifically, to provide a novel method of production which uses high strain point glass as the glass substrate and thereby enables production of a CIS-based thin film solar cell which has a high photoelectric conversion efficiency.

In one embodiment of the present invention, to solve the above problem, there is provided a method of production of a CIS-based thin film solar cell comprising the steps of forming an alkali control layer on a high strain point glass substrate, forming a back surface electrode layer on the alkali control layer, forming a CIS-based light absorption layer on the back surface electrode layer, and forming an n-type transparent conductive film on the CIS-based light absorption layer, wherein the alkali control layer is formed to a thickness which allows diffusion by heat treatment of the alkali metal which is contained in the high strain point glass substrate to the CIS-based light absorption layer and, furthermore, the CIS-based light absorption layer has an alkali metal added to it from the outside in addition to diffusion by heat treatment from the high strain point glass substrate.

In the above CIS-based thin film solar cell, the alkali metal may be made Na. Further, the alkali control layer may be formed by a silica film with a thickness of 3 to 12 nm. Furthermore, the alkali control layer may be formed by a silica film with a refractive index of 1.45 to 1.50 in range.

Further, the amount of addition of the alkali metal may be made from 0.02 at % to 0.1 at %. It is also possible to form the CIS-based light absorption layer by forming a metal precursor film which contains the alkali metal on the back surface electrode layer and selenize/sulfurize the metal precursor film. It is also possible to form the metal precursor film by sputtering and add the alkali metal to the CuGa sputter target.

As the high strain point glass substrate, it is possible to use one with a thermal expansion coefficient of $8 \times 10^{-6}/°$ C. to $9 \times 10^{-6}/°$ C. in range and with $Na_2O$ of 2 to 5 wt % in range.

It is also possible to configure the CIS-based light absorption layer by a five component compound having Cu, In, Ga, Se, and S as main ingredients. Furthermore, it is also possible to form the p-type CIS-based light absorption layer by selenization/sulfurization of a multilayer structure which contains Cu, In, and Ga or a metal precursor film of mixed crystals of the same.

According to the present invention, by using a high strain point glass substrate with a low alkali concentration (in particular, Na concentration) and providing on that an alkali control layer of a small thickness (for example, 3 to 12 nm), it is possible to supply an alkali metal, in particular Na, from the substrate to the CIS-based light absorption layer. Furthermore, to make up for the shortage of the alkali metal which is supplied from the substrate, the practice has been to add an alkali metal to the CIS-based light absorption layer from the outside other than the glass substrate. As a result, a sufficient concentration of Na is supplied to the CIS-based light absorption layer and, further, the CIS-based light absorption layer can be formed at a high temperature (for example, 570° C. or more), so it is possible to obtain a CIS-based thin film solar cell which has a high photoelectric conversion efficiency. Further, by providing an alkali control layer with a small thickness, diffusion of unnecessary elements from the substrate is prevented, while the alkali metal in the substrate continues to be supplied to the CIS-based light absorption layer constantly during the formation of this layer, so the quality of the CIS-based light absorption layer at the back surface electrode layer is improved and improvement of the photoelectric conversion efficiency is contributed to.

BRIEF DESCRIPTION OF DRAWINGS

FIG. 2 is a view which shows the relationship between the parameter of the structure and the photoelectric conversion efficiency of a CIS-based thin film solar cell which is produced by the method of production according to the present invention and another method.

FIG. 3 is a graph which shows the relationship between the thickness of alkali control layers (silica) of different samples and the photoelectric conversion efficiency in the case of using the amount of addition of Na as a parameter based on the data of FIG. 2.

FIG. 4 is a graph which shows the relationship between the amount of addition of Na of different samples and the photoelectric conversion efficiency in the case of using the silica film thickness as a parameter based on the data of FIG. 2.

DESCRIPTION OF EMBODIMENTS

Figure 1:
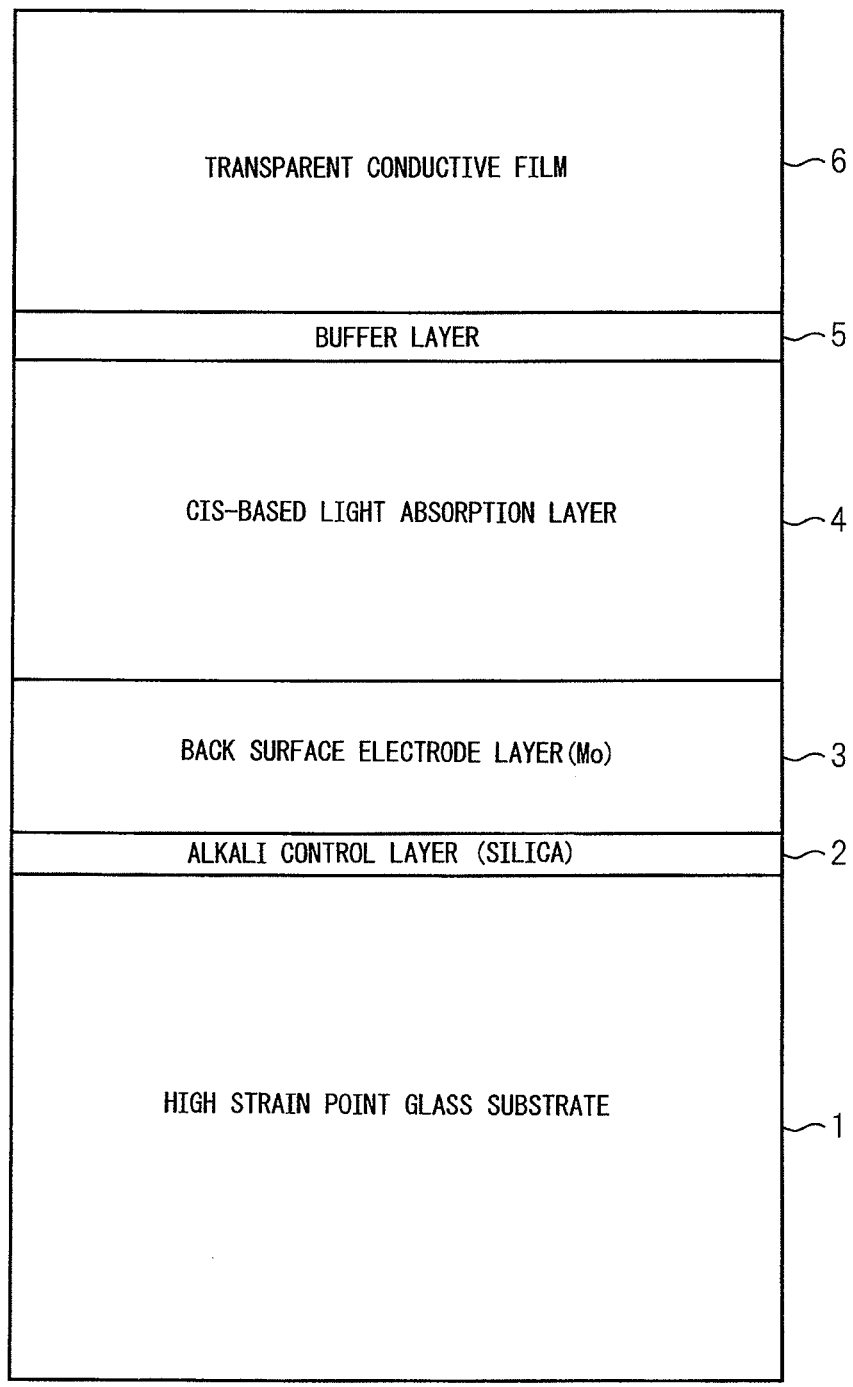
FIG. 1 is a schematic view which shows the configuration of a CIS-based thin film solar cell which can be produced by the method of production according to the present invention.

FIG. 1 shows the basic structure of a CIS-based thin film solar cell which is manufactured by a method according to one embodiment of the present invention. In FIG. 1, 1 indicates a high strain point glass substrate which contains $Na_2O$: 2 to 5 wt %. Reference numeral 2 indicates an alkali control layer which is made of silica ($SiO_x$), 3 a back surface electrode layer which is made of Mo, 4 a CIS-based light absorption layer which is comprised of a CIS-based semiconductor, 5 a high resistance buffer layer, and 6 a window layer which is formed by an n-type transparent conductive film.

Next, details and modifications of the components of the solar cell of FIG. 1 will be explained.

The high strain point glass substrate 1, for example, has the properties such as shown in Table 1.

TABLE 1

| Properties of High Strain Point Glass Substrate | |
|---|---|
| Thermal expansion coefficient | $8 \times 10^{-6}/°$ C. to $9 \times 10^{-6}/°$ C. |
| Content of $Na_2O$ | 2 to 5 wt % |
| Strain point | 560° C. to 600° C. |

Note that, the high strain point glass substrate which is able to be used in the method of production of the present invention is not limited to one which has the properties which are shown in Table 1. General high strain point glass contains $Na_2O$ in 1 to 7 wt % in range. Even if using such high strain point glass, the method of production according to the present invention can be worked. Further, there is also high strain point glass which deviates from this condition, but even with such glass, the method of production according to the present invention can be worked.

Next, the structure and the method of formation of the alkali control layer 2 will be explained. Samples 1 to 14 described as examples of the present invention in the later explained FIG. 2 were formed by silica film with an alkali control layer 2 of a thickness of 3 to 12 nm and with a refractive index of 1.45 to 1.50 (refractive index with respect to light of a wavelength of 633 nm) in range. However, the present invention is not particularly limited to this value. The silica film need only have a thickness of 15 nm or less. Further, in addition to a silica film, for example, $SiN_x$ etc. also have a suitable thickness and refractive index.

Such an alkali control layer 2, for example, may be used using $SiO_2$ or Si as a target by 1) the RF sputtering method, 2) AC sputtering method, or 3) DC sputtering method. In this case, it is possible to change the input power, $O_2$ concentration, and film forming pressure as parameters so as to form silica film having various thicknesses and refractive indexes. Note that, as other parameters, there are also the gas flow rate, substrate conveyance speed, etc.

Below, an example of the parameters for formation of the alkali control layer 2 will be given:

RF sputter method: $SiO_2$ target
Input power: 0.1 to 3.0 W/cm$^2$
$O_2$ concentration ($O_2/O_2+Ar$): 0 to 20 vol %
Film forming pressure: 0.3 to 2.0 Pa Note that, as the method of formation of the alkali control layer 2, in addition to the above sputtering methods, there are the plasma CVD method, electron beam vapor deposition method, etc. Even if using these methods, the present invention can be worked.

To identify the structure of the alkali control layer 2, not just the thickness, but also the refractive index is important. The amount of diffusion of an alkali element (in particular Na) from the substrate to the CIS-based light absorption layer is largely dependent on the thickness of the alkali control layer 2, but the inventors confirmed by experiments that the refractive index of the alkali control layer 2, in other words, the film quality such as the density and composition, also have an effect. Accordingly, in a method of production of one embodiment of the present invention, the alkali control layer 2 is formed so as to give a refractive index of 1.45 to 1.50 (refractive index with respect to light of wavelength of 633 nm).

That is, in one embodiment of the present invention, to manufacture a CIS-based thin film solar cell which has a high photoelectric conversion efficiency, it is important to form an alkali control layer 2 made of for example a silica film etc. with a refractive index of 1.45 to 1.50 on the high strain point glass at a thickness of 15 nm or less.

The back surface electrode layer 3 is usually formed by the DC sputtering method using Mo as a material. Table 2 shows the thickness and method of formation of the back surface electrode layer 3.

TABLE 2

| Configuration of Back Surface Electrode | |
|---|---|
| Thickness | 200 to 500 nm |
| Method of formation | DC sputtering<br>Film forming pressure: 1.0 to 3.0 Pa<br>Applied power: 1.0 to 3.0 W/cm$^2$ |

According to experiments by the inventors, it was confirmed that, when using the method of formation usually practiced in this field so as to form the back surface electrode 3 of Mo, if that thickness is within the range of 200 to 500 nm, there is not that great an effect on the photoelectric conversion efficiency of the thus manufactured CIS-based thin film solar cell.

Next, details of the CIS-based light absorption layer 4 will be shown. The CIS-based light absorption layer 4 is formed by forming a metal precursor film of a multilayer structure or mixed crystal containing Cu, In, and Ga on the back surface electrode layer 3 by a sputtering method, vapor deposition method, etc., then selenizing or sulfurizing the same. In one embodiment, the ratio of the number of atoms of Cu to the number of atoms of Group III elements such as In and Ga (Cu/Group III ratio) was made 0.85 to 0.95, the ratio of the number of atoms of Ga to the number of atoms of the Group III elements (Ga/Group III ratio) was made 0.15 to 0.4, and the selenization was performed at 350° C. to 600° C. and the sulfurization performed at 550° C. to 650° C. so as to form a light absorption layer of a thickness of 1 to 3 μm which has a p-type conductivity type.

In Samples 1 to 20 described as examples of the present invention in the later explained FIG. 2, copper indium gallium di-selenium/sulfide (Cu(InGa)(SeS)$_2$) was formed as the CIS-based light absorption layer 4, but the present invention is not limited to this configuration. It is sufficient that the layer be a I-III-VI$_2$ group chalcopyrite semiconductor.

For example, it may be
  copper indium di-selenide (CuInSe$_2$),
  copper indium di-sulfide (CuInS$_2$),
  copper indium di-selenium/sulfide (CuIn(SeS)$_2$),
  copper gallium di-selenide (CuGaSe$_2$),
  copper gallium di-sulfide (CuGaS$_2$),
  copper indium gallium di-selenide (Cu(InGa)Se$_2$),
  copper indium gallium di-sulfide (Cu(InGa)S$_2$), etc.

In one embodiment of the present invention, at the point of time of forming a metal precursor film of a multilayer structure of mixed crystals containing Cu, In, and Ga on the back surface electrode layer 3 by a sputtering method, vapor deposition method, etc., Na is included along with the metal precursor film material (for example, CuGa) in the sputter target or the vapor deposition source. In this case, for example, a sputter target of a CuGa alloy which contains NaF is used to form a CuGa film which contains Na on the back surface electrode layer 3, then an In sputter target is used to form an In film on that. Due to this, a metal precursor film which contains Na is formed.

In the subsequent process of selenization and sulfurization, the diffusion of the Na which is contained in the metal precursor film and the alkali elements from the high strain point glass results in the formation of a CIS-based light absorption layer with a good crystal quality. Note that, in the present embodiment, the Na which is included in the sputter target was made NaF, but it may also be Na alone or another Na compound. Furthermore, instead of including Na in the CuGa alloy sputter target, it is also possible to include Na (including NaF or another compound) in the In sputter target or Cu sputter target.

Next, details of the buffer layer 5 will be shown. In one embodiment of the present invention, as the buffer layer 5, it is possible to form a transparent, high resistance, 2 to 50 nm thick Zn(O, S, OH)$_x$ film which has an n-type of conductivity type. This buffer layer 5 can be formed by the chemical bath deposition method, MOCVD method, etc. Note that, in the present embodiment, as the buffer layer 5, a semiconductor film comprised of Zn(O, S, OH)$_x$ was formed, but the present invention is not limited to this embodiment. For example, it may also be a CdS, ZnS, ZnO, or other II-VI group compound semiconductor thin film or a mixed crystal of these, that is, Zn(O, S)$_x$, for example, In$_2$O$_3$, In$_2$S$_3$, In(OH), or other In-based compound semiconductor thin film.

Next, details of the window layer (transparent conductive film) 6 will be shown. In one embodiment of the present invention, a semiconductor film comprised of ZnO:B which has an n-type of conductivity type, has a broad band gap, is transparent, low in resistance, and has a thickness of 0.5 to 2.5 μm is formed. This window layer 6 can be formed by a sputter method or the MOCVD method. Further, other than ZnO:B, ZnO:Al or ZnO:Ga can be used. Furthermore, it may be a semiconductor film comprised of ITO (Indium Tin Oxide), SnO$_2$, etc.

In one embodiment of the present invention, to add Na to the CIS-based light absorption layer 4, it is possible to incorporate Na into the sputter target which forms the metal precursor film of the CIS-based light absorption layer 4. In another embodiment of the present invention, it is also possible to include Na in the sputter target which forms the back surface electrode layer 3. In still another embodiment, it is possible to adopt the method of adding a predetermined amount of Na to the CIS-based light absorption layer 4 by providing a mist coating which contains the Na element to the substrate 1) at a time after forming the alkali control layer 2 and before forming the back surface electrode layer 3, 2) at a time after forming the back surface electrode layer 3 and before forming the metal precursor film, and 3) after forming the metal precursor film. In this case, Na is uniformly diffused by heat diffusion in the CIS-based light absorption layer 4 due to heat treatment accompanying the selenization and sulfurization after providing the mist coating. As still another embodiment, when forming the CIS-based light absorption layer 4 by the simultaneous vapor deposition method, it is possible to add Na (or an Na compound) as a new vapor depositions source or to add Na to another vapor deposition source (Cu, Ga, etc.) so as to add Na to the CIS-based light absorption layer 4. Further, at the point of times of the above 1) and 2), after adding Na, the simultaneous vapor deposition method is used to form a CIS-based light absorption layer 4 whereby Na uniformly diffuses by heat in the CIS-based light absorption layer 4 by the heat treatment accompanying the simultaneous vapor deposition. As still another embodiment, when forming the metal precursor film by a multilayer structure, it is also possible to form a layer of an Na compound (for example, NaF, NaS, etc.) between the stacked metal films forming the metal precursor film (for example, Cu layer, Ga layer, CuGa layer, In layer, etc.) so as to add Na to the metal precursor film.

As still another embodiment, at a point of time after forming the CIS-based light absorption layer 4 (selenization/sulfurization or simultaneous vapor deposition), it is possible to adopt the method of providing a mist coating which contains an Na element to the CIS-based light absorption layer 4 and annealing this so as to add a predetermined amount of Na to the CIS-based light absorption layer 4.

The inventors ran various experiments as shown in FIG. 2 so as to clarify how to control the Na concentration in the CIS-based light absorption layer 4 in the CIS-based thin film solar cell of the structure which is shown in FIG. 1 so as to be able to obtain a CIS-based thin film solar cell which has a high photoelectric conversion efficiency.

FIG. 2 shows the results when manufacturing a plurality of CIS-based thin film solar cells by making the conditions other than the thickness of the alkali control layer 2 and the amount of addition of Na entering the sputter target when forming the metal precursor film in the CIS-based thin film solar cell of the structure of FIG. 1 the same and measuring the photoelectric conversion efficiencies of the respective CIS-based thin film solar cells. Specifically, as the thickness of the alkali control layer 2, four types of parameters of 0 nm, 3 nm, 12 nm, and 30 nm were selected, as the sputter target for introducing Na, CuGa was selected, and as the amount of addition of Na, six parameters of 0 at % (at %), 0.02 at %, 0.03 at %, 0.05 at %, 0.1 at %, and 0.15 at % were selected. Note that, the "at %" which shows the amount of addition of Na above is with respect to the number of atoms of the CIS-based light absorption layer and, in the present embodiment, is the ratio of the number of atoms to the total of the numbers of atoms of Cu, Ga, In, Se, and S. Further, in the embodiment, in forming the metal precursor film on the back surface electrode layer 3, a CuGa film is formed using a CuGa target to which NaF has been added and a CuGa film is formed using a CuGa target to which NaF has not been added and the thickness ratio of the two CuGa films is adjusted to adjust the amount of addition of Na entering the metal precursor film. The structures and formation conditions of the high strain point glass substrate 1, alkali control layer 2, and back surface electrode layer 3 of the CIS-based thin film solar cells which was used for the experiments are as shown in the following Table 3. Note that regarding the structures and formation conditions of the CIS-based light absorption layer 4, buffer layer 5, and window layer 6, in the Samples 1 to 45 used for the experiment which is shown in FIG. 2, the structures and formation conditions are the same except for the amounts of addition of Na. Films are formed within the above-mentioned range. Further, in the present embodiment, experiments were run for a 30 cm square solar cell module.

TABLE 3

Structure and Formation Conditions of Solar Cells Used for Experiments

| High strain point glass substrate 1 | Na$_2$O: 2.5 to 4 wt % thermal expansion coefficient: 8.1 to 8.7 × 10$^{-6}$/° C. |
| --- | --- |
| Alkali control layer 2 | Material: silica (SiO$_x$) Refractive index: 1.46 to 1.48 Method of formation: RF sputtering |
| Back surface electrode layer 3 | Material: Mo Method of formation: DC sputtering Thickness: 300 to 450 nm |

First, FIG. 2 will be explained. Samples 1 to 45 which are shown in FIG. 2 show CIS-based thin film solar cells which were prepared only differing in the thickness of the alkali control layer 2 and the amount of addition of Na in the metal precursor film and were made the same in the rest of the structure and formation conditions. In FIG. 2, the relationship of the thickness of the alkali control layer 2 and the amount of addition of Na (at % of Na in CIS-based light absorption layer 4) and the photoelectric conversion efficiency (Eff) is shown for each of these samples. The CIS-based thin film solar cells of Samples 1 to 20 all had a high photoelectric conversion efficiency and were believed to have been controlled well in Na concentration in the CIS-based light absorption layer 4. Therefore, Samples 1 to 20 are called samples which are manufactured by the method according to one embodiment of the present invention, that is, examples of the present invention.

Samples 1 to 10 have a thickness of the alkali control layer 2 of 3 nm and an amount of addition of Na in the metal precursor film changed to the four values of 0.1 at %, 0.02 at %, 0.03 at %, and 0.05 at %. In Samples 11 to 20, the thickness of the alkali control layer 2 was made 12 nm and the amount of addition of Na in the metal precursor film was changed to the three types of values of 0.1 at %, 0.02 at %, and 0.05 at % to prepare CIS-based thin film solar cell. As shown by the column of photoelectric conversion efficiency (Eff) in FIG. 2, in Samples 1 to 20, despite the change of the thickness and change of the amount of addition of Na, a high photoelectric conversion efficiency could be achieved in each case.

In Samples 21 to 29, the results when manufacturing CIS-based thin film solar cells where the thickness of the alkali control layer 2 was changed to 3 nm, 12 nm, and 30 nm and no Na was added to the metal precursor film (amount of addition of Na: 0) are shown. The photoelectric conversion efficiency of these CIS-based thin film solar cells was lower than even the case of the Samples 1 to 20 and was not a value able to withstand practical use. Therefore, these samples are excluded from examples of the present invention and are called "first comparative examples". In the samples of the first comparative examples, even if making the thickness of the alkali control layer 2 an extremely thin 3 nm so as to increase the diffusion of Na from the high strain point glass substrate 1 to the CIS-based light absorption layer 4, the high photoelectric conversion efficiency could not be achieved. Further, if making the thickness greater, the photoelectric conversion efficiency falls. From this, it is learned that in manufacturing a CIS-based thin film solar cell, with just diffusion of Na from the high strain point glass substrate 1, it is not possible to supply an amount of Na enabling achievement of a high photoelectric conversion efficiency to the CIS-based light absorption layer 4.

Samples 30 to 35 show CIS-based thin film solar cells which were formed by making the thickness of the alkali control layer 2 30 nm so as to substantially block diffusion of Na from the high strain point glass substrate 1 to the CIS-based light absorption layer 4 and, further, by adding Na to the metal precursor film. Sample 30 to 35 are defined as second comparative examples. In the second comparative examples, the photoelectric conversion efficiency of the samples was uniformly lower than Samples 1 to 20. For example, in the case of Samples 30 and 31 where the amount of addition of Na was made 0.05 at %, the photoelectric conversion efficiency was lower than even the case of Samples 21 to 27 where the amount of addition of Na was made 0 and the thickness was made 3 nm and 12 nm. When making the amount of addition of Na 0.1 at %, the photoelectric conversion efficiency is improved, but that value is lower than the case of the examples of the present invention of Samples 1 to 20.

Samples 36 to 45 show CIS-based thin film solar cells which were manufactured without providing the alkali control layer 2. Samples 36 to 45 are defined as third comparative examples. In the third comparative examples, the photoelectric conversion efficiency of the sample was more varied than Samples 1 to 20. For example, if comparing Samples 36 and 37 or Samples 40 and 41, despite the structure and formation conditions being the same, a large difference arose in the photoelectric conversion efficiency. This is believed to be because no alkali control layer 2 is provided, so impurities other than Na are eluted from the high strain point glass substrate 1 to the CIS-based light absorption layer and due to this the samples differ in amounts of elution of impurities and in each sample, the amounts of elution of impurities locally increase.

FIG. 3 and FIG. 4 show the data which is shown in FIG. 2 graphed. In FIG. 3, the relationship of the photoelectric conversion efficiency Eff (ordinate) to the thickness of the alkali control layer (silica layer) (abscissa), when using the amount of addition of Na as a parameter, is plotted. Further, in FIG. 4, based on the data which is shown in FIG. 2, the relationship of the photoelectric conversion efficiency Eff (ordinate) to the amount of addition of Na (abscissa), when using the thickness of the alkali control layer 2 as a parameter, is plotted.

Referring to FIG. 3, in Samples 21 to 29 (shown by x in FIG. 3) to which, other than the Na due to diffusion from the high strain point glass substrate 1, no Na is added from the outside, a high photoelectric conversion efficiency is never achieved by these samples, contrary to the samples of the present embodiment (shown by □ in the figure). This is believed because the amount of diffusion of alkali elements (in particular Na) to the CIS-based light absorption layer 4 is insufficient.

If focusing on the samples of the first comparative examples, the photoelectric conversion efficiencies of Samples 24 to 27 are higher than Samples 28 and 29, while the photoelectric conversion efficiencies of Samples 21 to 23 are higher than Samples 24 to 27. This is believed to be because the thinner the alkali control layer 2, the greater the amount of diffusion of alkali element from the high strain point glass substrate 1 and, as a result, the more the quality of the CIS-based light absorption layer 4 is improved.

Further, in the samples of the second comparative example where diffusion of alkali elements from the high strain point glass substrate 1 is prevented and Na from other than the glass substrate 1 is introduced into the CIS-based light absorption layer 4, the photoelectric conversion efficiency never exceeds 13%. Regarding the samples of the second comparative examples, if referring to FIG. 4, Samples 30 and 31 are low in photoelectric conversion efficiency compared with Samples 32 and 33, so in the case of Samples 30 and 31, it is believed the amount of diffusion of alkali elements (in particular Na) to the CIS-based light absorption layer 4 is insufficient. However, even if, like in Samples 34 and 35, making the amount of addition of Na increase, the photoelectric conversion efficiency is not improved over Samples 32 and 33 and the photoelectric conversion efficiency drops compared with Samples 32 and 33. This is believed to be possibly be because when adding Na from other than the substrate, up to a certain amount contributes to improvement of the quality of CIS-based light absorption layer 4, but excessive addition of Na from other than the substrate over a certain amount causes the distribution of Na in the CIS-based light absorption layer 4 to become uneven and results in fine peeling between the CIS-based light absorption layer 4 and the back surface electrode layer 3 resulting in a drop in photoelectric conversion efficiency.

From the above results, it is clear that the amount of introduction of an alkali element to the CIS-based light absorption layer 4 contributes to improvement of the photoelectric conversion efficiency, but with just regulating the amount of introduction, it is difficult to achieve a high photoelectric conversion efficiency. It is learned that the method of introduction of an alkali element to the CIS-based light absorption layer 4 has a great effect on the improvement of the photoelectric conversion efficiency. More specifically, like in the second comparative examples, if just adding Na from other than the glass substrate 1, even if the amount of addition were sufficient, no great improvement of the photoelectric conversion efficiency can be expected. By introducing an alkali element to the CIS-based light absorption layer 4 from both the substrate and other than the substrate like in the present embodiment, it becomes possible to achieve a high photoelectric conversion efficiency. This is because in the heat treatment during the process of formation of the CIS-based light absorption layer 4, the alkali element which is contained in the glass substrate 1 continues to be constantly supplied to the CIS-based light absorption layer 4 during this heat treatment and, furthermore, the shortfall in the amount of diffusion of the alkali element from just the high strain point glass, that is, the glass substrate 1, is added from other than the glass substrate 1. The two actions have a synergistic effect, whereby the quality of the CIS-based light absorption layer 4 can be greatly improved.

Note that, in the present embodiment, the alkali control layer is an essential requirement. The way an alkali element is discharged from the glass substrate 1 is not uniform, so by providing the alkali control layer 2, the effect is exhibited of uniform diffusion of the alkali element to the CIS-based light absorption layer 4 and improvement of the uniformity of the quality of the CIS-based light absorption layer 4. Furthermore, by having the glass substrate 1 contain elements unnecessary for the CIS-based light absorption layer 4 and providing the alkali control layer 2, another action/effect is exhibited of prevention of diffusion of the unnecessary elements from the glass substrate 1.

The invention claimed is:

1. A method of production of a CIS-based thin film solar cell, comprising the steps of, forming an alkali control layer on a high strain point glass substrate, forming a back surface electrode layer on said alkali control layer, forming a CIS-based light absorption layer on said back surface electrode layer, and forming an n-type transparent conductive film on said CIS-based light absorption layer, wherein said alkali control layer is formed to a thickness which allows diffusion by heat treatment of the alkali metal which is contained in said high strain point glass substrate to said CIS-based light absorption layer and, furthermore, said CIS-based light absorption layer has an alkali metal added to it from the outside in addition to diffusion by heat treatment from said high strain point glass substrate.

2. A method of production of a CIS-based thin film solar cell as set forth in claim 1, characterized in that said alkali control layer is formed of a silica film with a thickness of 3 to 12 nm.

3. A method of production of a CIS-based thin film solar cell as set forth in claim 2, characterized in that said alkali control layer is formed of a silica film with a refractive index of 1.45 to 1.50 in range.

4. A method of production of a CIS-based thin film solar cell as set forth in claim 1, characterized in that the amount of addition of said alkali metal is from 0.02 at % to 0.1 at %.

5. A method of production of a CIS-based thin film solar cell as set forth in claim 1, characterized in that said alkali metal is Na.

6. A method of production of a CIS-based thin film solar cell as set forth in claim 5, characterized in that said high strain point glass substrate has a thermal expansion coefficient of $8\times10^{-6}/°$ C. to $9\times10^{-6}/°$ C. in range and includes $Na_2O$ of 2 to 5 wt % in range.

7. A method of production of a CIS-based thin film solar cell as set forth in claim 1, characterized in that said CIS-based light absorption layer is formed by forming a metal precursor film which contains said alkali metal on said back surface electrode layer and selenizing/sulfurizing the metal precursor film.

8. A method of production of a CIS-based thin film solar cell as set forth in claim 7, characterized in that the metal precursor film is formed by sputtering and the alkali metal is added to the CuGa sputter target.

9. A method of production of a CIS-based thin film solar cell as set forth in claim 1, characterized in that said CIS-based light absorption layer is made of a five component compound having Cu, In, Ga, Se, and S as main ingredients.

10. A method of production of a CIS-based thin film solar cell as set forth in claim 9, characterized in that said CIS-based light absorption layer is formed by selenization/sulfurization of a multilayer structure which contains Cu, In, and Ga or a metal precursor film of mixed crystals of the same.

* * * * *